United States Patent [19]

Frass

[11] 3,905,820

[45] Sept. 16, 1975

[54] LIGHT SENSITIVE COPOLYMERS, A PROCESS FOR THEIR MANUFACTURE AND COPYING COMPOSITIONS CONTAINING THEM

[75] Inventor: Werner Frass, Wiesbaden-Biebrich, Germany

[73] Assignee: Hoechst Aktiengesellschaft, Germany

[22] Filed: May 7, 1974

[21] Appl. No.: 467,740

Related U.S. Application Data

[62] Division of Ser. No. 327,100, Jan. 26, 1973, Pat. No. 3,857,822.

[30] Foreign Application Priority Data

Jan. 27, 1972 Germany .......................... 2203732

[52] U.S. Cl. ...................... 96/86 P; 96/33; 96/35.1; 96/36.2; 96/36.3; 96/67; 96/87 R; 96/115 P; 96/115 R; 204/159.14; 204/159.15

[51] Int. Cl.[2] .......................................... G03C 1/70

[58] Field of Search ............ 96/115 R, 86 P, 115 P; 204/159.14, 159.15, 159.16

[56] References Cited

UNITED STATES PATENTS

| | | | |
|---|---|---|---|
| 2,977,334 | 3/1961 | Zopf et al. | 260/27 |
| 3,832,187 | 8/1974 | Kleeberg et al. | 96/115 R |

*Primary Examiner*—Ronald H. Smith
*Attorney, Agent, or Firm*—James E. Bryan

[57] ABSTRACT

This invention relates to a light-sensitive copying composition which contains from 65 to 99 per cent by weight of at least one copolymer containing from 10 to 55 mole per cent of N-allyl-maleimide units, from 0 to 15 mole per cent of maleic acid units and from 45 to 80 mole per cent of units of the formula —$CH_2$—CHZ—, wherein X is selected from the group consisting of a hydrogen atom, a halogen atom, an alkyl or alkoxy group containing from 1 to 3 carbon atoms, an aryl group or an acyloxy group, and Z is selected from the group consisting of a hydrogen atom, a halogen atom or an alkyl group containing 1 to 2 carbon atoms, from 0 to 35 per cent by weight of at least one photopolymerizable compound having at least two vinyl or vinylidene groups in the molecule and which boils above 100°C under standard pressure, and from 1 to 8 per cent by weight of at least one photoinitiator.

8 Claims, No Drawings

LIGHT SENSITIVE COPOLYMERS, A PROCESS FOR THEIR MANUFACTURE AND COPYING COMPOSITIONS CONTAINING THEM

This is a division of application Ser. No. 327,100, filed Jan. 26, 1973, now U.S. Pat. No. 3,857,822.

This invention relates to light-sensitive copolymers, to a process for their manufacture and to light-sensitive copying compositions containing them.

Light-sensitive polymers containing allyl groups and their use in light-sensitive copying compositions are described in German Offenlegungsschrift No. 1,547,849. Prepolymers of allyl esters having at least two double bonds are preferably used. These allyl esters are polymerized to a point just before gel formation. The polymerization is then stopped and the polymer is precipitated. The products are then still soluble and fusible and are, therefore, easily processable. They possess good sensitivity to light and good heat stability which gives them a good shelf life. However, these prepolymers have the disadvantage that their molecular weight cannot be raised above a certain limit. They are lacquer resins having the properties known for such resins. A further disadvantage of these prepolymers is that the light-sensitive copying compositions manufactured from them must, in general, be developed with an organic solvent after exposure, that is after photochemical cross-linking of the image areas. However, the possibility of aqueous developing would be desirable, inter alia for reasons of environmental hygiene, since most of the organic solvents hitherto used as developers have strong odors and they not infrequently are harmful to health; therefore processing and the removal of solvent vapor presents difficulties, particularly in small graphic factories.

It also has been found that typical examples of the above-mentioned allyl prepolymers are only conditionally suitable for the manufacture of etch resins. Thus, for example, to manufacture relief printing plates, zinc plates are coated with a light-sensitive resin layer and are then exposed, developed and subsequently etched with nitric acid. During etching, in order to prevent etching underneath the etching side walls and to achieve a good side-wall structure, so-called side-wall protectants are added to the etching acid, these protectants being oily substances which, when emulsified in the acid, are intended to prevent the acid from attacking the block of the printing image from the side. It is just such side-wall protectants which are capable of swelling layers of allyl ester prepolymers during the etching process to such an extent that the polymer layer becomes detached from the zinc plate.

The use of allyl ester prepolymers in light-sensitive layers is also restricted by the fact that the typical examples of this class of compound, for example the prepolymer of diallyl isophthalate, display strong incompatibility effects towards other polymers. This incompatibility prevents modification of light-sensitive compositions containing such prepolymers by addition of other polymeric substances, and is rather disadvantageous.

It is known from German Offenlegungsschrift No. 1,925,551 that light-sensitive polymers having allyl ester of allyl amide side-chains may be obtained by the reaction of polymers containing carboxylic acid anhydride groups with substituted allyl alcohols or allylamines. The manufacture of these polymeric allyl compounds is, however, rather involved because they are formed in the reaction mixture in a form which is relatively difficult to isolate.

It was, therefore, the purpose of the invention to provide in a convenient manner, light-sensitive polymers containing allyl groups, of any desired molecular weight, which during an etching process display a sufficient resistance to etching and to side-wall protectants. At the same time, the polymers as far as possible should be capable of being developed in an aqueous medium and preferably should be compatible with other polymers.

The present invention provides a copolymer containing from 10 to 55 mole percent of N-allyl-maleimide units, from 0 to 15 mole percent of maleic acid units and from 45 to 80 mole percent of units of the formula $$-CH_2-CXZ-$$

wherein X is a hydrogen atom, a halogen atom, an alkyl or alkoxy group having from 1 to 3 carbon atoms, an aryl group or an acyloxy group, and Z is a hydrogen atom, a halogen atom or an alkyl group having 1 or 2 carbon atoms.

The present invention also provides a process for the manufacture of the copolymers which comprises reacting a copolymer containing from 20 to 55 mole percent of maleic anhydride units and from 45 to 80 mole percent of units of the formula $$-CH_2-CXZ-$$

wherein X and Z have the meaning given above, with from 70 to 300 mole percent of allylamine, relative to maleic anhydride units, in a lower aliphatic carboxylic acid solvent.

The present invention also provides a light-sensitive copying composition comprising from 65 to 99 parts by weight of at least one copolymer of the invention, from 0 to 35 parts by weight of at least one photopolymerizable compound having at least two vinyl or vinylidene groups and which boils above 100°C under standard pressure, and from 1 to 8 parts by weight of at least one photoinitiator.

The copolymers of the invention are light-sensitive and are cured under the influence of actinic radiation. They are, therefore, suitable, for example, for the manufacture of lacquers and coatings, but especially for the manufacture of light-sensitive copying compositions. They can be easily manufactured and isolated in a relatively pure form according to the process of the invention.

Surprisingly, the diallylamide derivatives are not formed in the process of the invention, even when an excess of allylamine is used; rather, the acid number, iodine number and nitrogen content of the copolymers show that the compounds are the corresponding allylimides.

Table 1 below gives analytical data of some copolymers obtained by the process of the invention. The starting substances used were copolymers of methyl vinyl ether and maleic anhydride (molar ratio 1:1) of various molecular weights (Gantrez AN 169 of GAF Corporation — high molecular weight, AN 139 — medium molecular weight, and AN 119 — low molecular weight) and an ethylene-maleic anhydride 1:1 copolymer (EMA 31). The calculated values are based on the indicated conversion to N-allyl-maleimide units, and complete saponification to maleic acid was assumed for the remainder of the maleic anhydride units.

TABLE I

| Starting Compounds | | Copolymer obtained by process of invention Iodine Number | Acid Number | Nitrogen Content |
|---|---|---|---|---|
| GANTREZ AN 169 | Found | 129.8 | 10 | 7.2% |
| FOR 99% conversion | Calculated | 128.8 | 4 | 7.1% |
| GANTREZ AN 139 | Found | 129.5 | 7 | 7.0% |
| for 99% conversion | Calculated | 128.8 | 4 | 7.1% |
| GANTREZ AN 119 | Found | 125 | 35 | 6.8% |
| for 95% conversion | Calculated | 124.4 | 29 | 6.9% |
| EMA 31 | Found | 151.2 | 15.4 | 8.1% |
| for 97% conversion | Calculated | 150 | 21 | 8.1% |

A preferred embodiment of the process of the invention is carried out as follows:

The allylamine is added dropwise, while stirring, to a suspension of the polymer containing anhydride groups in an approximately 6 to 10-fold amount by weight of aliphatic carboxylic acid. In the course thereof the reaction mixture becomes warm. Thereafter, it is heated to a higher temperature, for example to 80° to 130° C and is maintained for 3 to 4 hours at this temperature. Preferably, aliphatic carboxylic acids which boil in this temperature range are employed, the reaction being carried out under reflux. The reaction product is precipitated by pouring the reaction mixture into water and the product is purified by dissolving it in acetone or methyl ethyl ketone and reprecipitating it by pouring the solution into water. It has proved advantageous to acidify the water slightly when reprecipitating, since this results in a granular consistency of the polymer and hence in better working up.

The amount of the allylamine employed depends on how many allyl groups cross-linkable by light and how many free COOH groups the reaction product is to contain. Table II below shows, for GANTREZAN-119 starting copolymer, the influence which the molar ratio of the reactants has on the acid number and iodine number of the end product:

TABLE II

| Amount of GANTREZ-AN-119 | Amount of Allylamine | Reaction Time | Acid Number of Product | Iodine Number of Product |
|---|---|---|---|---|
| 1 mole | 2.2 moles | 2 hrs. | 35 | 125 |
| 1 mole | 1 mole | 2 hrs. | 62 | 121 |
| 1 mole | 0.85 mole | 2 hrs. | 85 | 110 |
| 1 mole | 0.75 mole | 2 hrs. | 141 | 94 |

The fact that on increasing the amount of the allylamine from 1 mole to 2.2 moles the iodine number shows practically no further change indicates that splitting open of the imide ring to give the diallylamide does not take place. The process according to the invention has the advantage that it does not require a great excess of allylamine and that it leads, in a relatively short reaction time, to a product which can be worked up well.

The copolymers of the invention show great advantages especially over the amido compounds described in DOS 1,925,551, which are manufactured by reacting polymers containing carboxylic acid anhydride groups with an excess of the amine or in a solvent such as, for example, methyl ethyl ketone or a chlorinated hydrocarbon; the reaction mixture of a vinyl methyl ether/-maleic anhydride copolymer with excess amine is a viscous, sticky composition. In the case of the process of the present invention, one is dealing with a homogeneous solution of relatively low viscosity, which easily can be handled and metered and from which the product can be precipitated by means of water because the aliphatic carboxylic acid used as a solvent is soluble in water. Furthermore, the use of a carboxylic acid as solvent makes it possible to raise the reaction temperature up to the boiling point of the carboxylic acid without the readily volatile allylamine boiling under reflux.

According to the process of the invention, it is possible to convert polymers containing anhydride groups, of practically any desired molecular weight, into their allylimides provided that the starting polymer is at least partially soluble in the hot aliphatic carboxylic acid solvent and that the end product is completely soluble therein. Within certain limits it is possible to produce a desired proportion of free carboxyl groups in the polymer, either by varying the ratio of polymer having anhydride groups to allylamine, or by stopping the reaction before completion thereof, when a certain excess of allylamine is present. As a result of this controlled production of carboxyl groups in the light-sensitive polymer it is possible to produce a degree of solubility thereof in alkali which renders possible aqueous alkaline development of the copying compositions of the invention.

Copolymers containing dicarboxylic acid anhydride units, especially copolymers of maleic anhydride, are suitable for use as the starting material for the manufacture of the copolymers of the invention. The proportion of maleic anhydride units is generally between 20 and 55 mole percent, preferably 40 to 55 mole percent. Examples of suitable comonomers are ethylene, propylene, butene-1, methyl vinyl ether, propyl vinyl ether, vinyl acetate, vinyl propionate, vinyl benzoate, vinyl chloride, vinylidene chloride, styrene, vinyl toluene, α-methylstyrene, α-chlorostyrene, and p-chlorostyrene.

The reaction with allylamine is carried out in a lower aliphatic carboxylic acid, preferably in glacial acetic acid. It is, however, also possible to use other acids, for example formic acid, propionic acid or methoxyacetic acid.

The reaction is carried out at an elevated temperature, preferably in a range of from about 80° to 130°C. Hence, reaction media which boil under reflux in this temperature range are preferably used.

Light-sensitive copying compositions may contain a copolymer of the invention as the sole photo-active substance, which may be in combination with a low molecular weight photopolymerizable vinyl or vinylidene compound.

The present invention also provides a light-sensitive copying material including a copying composition of the invention. The copying materials may be in the form of solid self-supporting copying layers, or light-sensitive copying layers on a carrier, or of a solution of dispersion in a solvent, (a so-called "copying lacquer") and may be commercially utilized in any one of these forms. Suitable carrier materials are, for example, aluminum, zinc, copper or fine-mesh nylon fabrics.

In a preferred form, in combination with a low molecular weight photopolymerizable compound, the copying compositions of the invention have a high sensitivity to light. The photopolymerizable compounds should contain at least two unsaturated groups per molecule, esters of acrylic acid and/or methacrylic acid with polyhydric alcohols being preferred.

The copying compositions furthermore contain a photoinitiator which absorbs actinic light and initiates, from the excited state, the cross-linking or polymerization of the light-sensitive composition. The light-sensitivity of compositions containing polymeric allylimides and photomonomers is even higher, and their density of cross-linking in the exposed state is even greater, than in the case of compositions containing only polymeric allylimides, and this manifests itself, inter alia, in the lesser mechanical sensitivity of such formerly known layers during developing. If a photopolymerizable compound is added to the composition, its proportion is in general from 0 to 35 percent by weight, preferably from about 10 to 30 percent by weight, based on the total weight of the dry composition.

As photoinitiators, it is possible to use compounds from the most diverse groups of initiators. There may be mentioned, for example, azido compounds, for example 2,6-bis-p-azidobenzal-4-methylcyclohexanone, aromatic ketones, for example Michler's ketone or benzanthrene, nitrogen-containing heterocyclic compounds, for example 9-phenyl-acridine, or mixtures of initiators, for example Michler's ketone together with benzil or substituted benzils. Metal salts, for example iron-III chloride, are also capable of initiating the photo-crosslinking of the allylimide polymers.

Suitable low molecular weight photopolymerizable compounds which may be combined with the copolymers of the invention are, above all, acrylic acid esters or methacrylic acid esters of aliphatic or araliphatic, straight-chain, branched-chain or cyclic dihydroxy, trihydroxy, tetrahydroxy pentahydroxy or other polyhydroxy compounds, of which a carbon chain or ring may be interrupted by one or more hetero-atoms. Thus, for example, there may be used the diesters of ethylene glycol, diethylene glycol, triethylene glycol, tetraethylene glycol, polyethylene glycols, neopentyl glycol, butylene glycol or of guaiacol glycerine ether, the diesters or triesters of trimethylolethane, trimethylolpropane or pentaerythritol or of the reaction products of these alcohols with ethylene oxide or propylene oxide, or the reaction products of hydroxyethyl methacrylates with isocyanates described in German Pat. application No. P 20 64 079. Polyfunctional methacrylamides and acrylamides also can be used.

The photoinitiator or sensitizer is used in an amount of 1 to 8, preferably 2 to 6, percent by weight based on the total weight of the light-sensitive composition.

The light-sensitive copying material is exposed under an original, the light source being in no way critical provided the light it emits is sufficiently intense in the region of the spectrum in which absorption bands of the photoinitiator are located. Examples of possible light sources are xenon lamps, carbon arc lamps, mercury vapor lamps and fluorescent lamps.

As a result of this exposure, those regions of the light-sensitive material which are struck by the actinic light are cross-linked and hence become less soluble in the developer. The image thus obtained is developed by dissolving the unexposed parts of the layer from the carrier. Two different methods can be followed for this purpose:

If the layer contains a copolymer of sufficiently high acid number it can be developed by treatment with an aqueous, weakly alkaline solution to which wetting agents or the like may be added, if appropriate. In this case, the regions hardened by the actinic light are left on the carrier. Alternatively, if the layer is insufficiently soluble in alkali to be developed with dilute aqueous alkali, the layer may be developed with an organic solvent. In principle, any solvent which can be used in preparing a coating solution for the manufacture of the light-sensitive copying material is suitable for this purpose. However, for practical reasons readily volatile organic solvents are preferably used for developing the exposed material, so as not to extend the drying time of the developed material unnecessarily.

The most diverse types of organic substances can be used as organic solvents for the light-sensitive copolymers of the invention. Their solubility depends in part on the comonomer used for the manufacture of the copolymers, and also depends somewhat on the ratio of the amount of free carboxyl groups to allylimide groupings.

For example, the following solvents may be used: ethers, for example tetrahydrofuran, dioxane, ethylene glycol monomethyl ether and ethylene glycol dimethyl ether, ketones, for example acetone, methyl ethyl ketone, cyclohexanone or 4-methoxy-4-methyl-pentanone-2, chlorinated hydrocarbons, for example methylene chloride, esters, for example ethyl acetate or ethylene glycol monomethyl ether acetate, or other solvents, for example glacial acetic acid.

The steps which have been described for processing the light-sensitive material are independent of whether the copolymers of the invention are used alone or together with low molecular weight photo polymerizable compounds.

The following Examples illustrate the invention. Unless otherwise stated the percentages quoted are on a weight basis.

EXAMPLE 1

A coating solution comprising 4.0 g of the copolymer described below and 0.2 g of Michler's ketone in 46.0 g of methyl ethyl ketone is filtered and applied by means of a whirler-coating apparatus, at 100 revolutions per minute, to a commercially available electrochemically roughened aluminum foil. The resulting plate is dried for 10 minutes at 50°C in a drying cabinet and is exposed under a negative original for 6 minutes in the vacuum frame of an 8,000 W xenon exposure apparatus (72 cm distance from the light source).

The exposed plate is developed by 1 minute's immersion in methyl ethyl ketone. After rendering the plate hydrophilic with a solution comprising 80 parts by volume of gum arabic (14° Be)

12 parts by volume of phosphoric acid (85%)

0.2 part by volume of hydrofluoric acid (50%)

0.5 part by volume of hydrogen peroxide (30%), and 7.3 parts by volume of water and after inking with a fatty ink, several tens of thousands of prints may be obtained from the plate on an offset printing machine.

The copolymer used is manufactured as follows:

126 g (1 mole) of ethylene/maleic anhydride copolymer in a 1:1 molar ratio (EMA 21) are suspended in 750 g of glacial acetic acid. 43 g (0.75 mole) of allylamine are added dropwise and the reaction mixture is heated to 112° C for 2 hours. After this time, 0.5 g of p-methoxyphenol is added, the mixture is cooled and the product is precipitated in water. The coarsely granular precipitate is filtered off, washed with water and twice reprecipitated by dissolving it in acetone and pouring it into water acidified with hydrochloric acid. After drying, the yield is 137 g = 88% of the theoretical yield.

Ethylene/maleic acid/N-allylimide copolymer ($C_9H_{11}NO_2$)

| | | | |
|---|---|---|---|
| Analysis: | Found | 6.3% N, | Iodine number 116.8<br>Acid number 163.5 |
| for 74% conversion | Calculated | 6.5%, | Iodine number 118,<br>Acid number 179. |

EXAMPLE 2

A printing plate is manufactured, and exposed, as described in Example 1 and is developed by wiping it for one minute with a solution comprising 15 parts by weight of sodium metasilicate enneahydrate 3 parts by weight of polyglycol 6,000, 0.6 part by weight of laevulinic acid, and 0.3 part by weight of strontium hydroxide octahydrate in 1,000 parts by weight of water which has been diluted with water in the ratio of 3:1. The plate is rendered hydrophilic with dilute phosphoric acid and is then inked with a fatty ink. The plate is capable of printing several tens of thousands of prints on an offset printing machine.

EXAMPLE 3

A coating solution comprising 8 g of the copolymer described in Example 1

2 g of pentaerythritol triacrylate and 0.36 g of Michler's ketone in 92.0 g of methyl ethyl ketone, is filtered and applied, as described in Example 1, to an electrochemically roughened aluminum foil. After 2 minutes' exposure under a negative original as in Example 1, the plate is developed by immersion for 1 minute in methyl ethyl ketone. The plate is further processed as described in Example 1. It is capable of printing several tens of thousands of prints on an offset printing machine.

EXAMPLE 4

A commercially available roughened aluminum foil is coated on a whirler apparatus with the coating solution described in Example 3. The plate is dried and is exposed for 5 minutes under a negative original, as described in Example 1. The plate is wiped for 45 seconds with a sodium metasilicate solution which is obtained by diluting the solution mentioned in Example 2 with 4,000 parts by weight of water. The plate is rendered hydrophilic with dilute phosphoric acid and is then inked with a fatty ink. Several tens of thousands of prints can be produced from this plate on an offset printing machine.

EXAMPLE 5

A coating solution comprising 8 g of the polymer described below, 2 g of pentaerythritol triacrylate, and 0.36 g of Michler's ketone in 92 g of 4-methyl-4-methoxy-pentanone-2, is filtered and applied, by means of a whirler-coating apparatus, onto commercially available electrochemically roughened aluminum foil. The plate thus obtained is dried for 10 minutes at 50°C and is subsequently exposed for 2 minutes under a negative original as described in Example 1. The exposed plate is developed by dipping it for 1 minute in acetone, wiping it with the solution mentioned in Example 1 to impart hydrophilic properties thereto, and inking it with a fatty ink. Several tens of thousands of prints can be printed on an offset printing machine from the plate thus obtained.

The light-sensitive polymer is manufactured as follows:

234 g (1.5 moles) of GANTREZ AN 139 are suspended in 1,400 g of glacial acetic acid. 190 g (3.1 moles) of allylamine are added dropwise to this suspension over the course of 10 minutes. While doing so, the temperature rises to 70°C and the reaction mixture becomes viscous. The polymer solution is boiled under reflux for 2 hours at 118°C. Thereafter, the solution is cooled, 0.2 g of p-methoxyphenol is added and the product is precipitated from water. The granular product is filtered off, washed with water until neutral and dried in air. The substance is purified twice more by reprecipitation from acetone/water acidified with HCl. Yield 245 g = approx. 84% of the theoretical yield.

| | | | |
|---|---|---|---|
| Analysis: | Found | 7.0% N, | iodine number 129.5,<br>acid number 7.0 |
| for 99% conversion, | Calculated | 7.1% N, | iodine number 128.8,<br>acid number 4.0. |

EXAMPLE 6

A solution comprising 8 g of the polymer used in Example 5 and 0.4 g of Michler's ketone in 92.0 g of 4-methyl-4-methoxy-pentanone-2 is filtered and applied, at 100 revolutions per minute, onto commercially available electrochemically roughened aluminum foil. The plate is dried and then exposed for 4 minutes as described in Example 1. Development is carried out as described in Example 5. Several tens of thousands of prints can be printed from the planographic printing plate thus obtained.

EXAMPLE 7

A solution comprising 8 g of the polymer described below, 2 g of pentaerythritol triacrylate and 0.36 g of Michler's ketone in 92.0 g of methyl ethyl ketone is filtered and whirler-coated onto commercially available electrochemically roughened aluminum foil. After drying, the pre-sensitized printing plate thus obtained has a coating weight of 3.5 g/m$^2$. The plate is exposed for 2 minutes under a negative original as described in Example 1, is developed by immersion for 1 minute in methyl ethyl ketone and is rendered hydrophilic by treatment with the solution mentioned in Example 1. The plate is then inked with fatty ink. More than 100,000 prints can be printed from this plate on an offset printing machine.

The polymer used is manufactured as follows: 151 g (1.2 moles) of ethylene/maleic anhydride copolymer (EMA 31) are suspended in 900 g of glacial acetic acid and 68.3 g (1.2 moles) of allylamine are added. In the course thereof, the temperature rises. It is subsequently raised to 120°C and kept thereat for 4 hours. The reaction mixture is cooled, 0.2 g of p-methoxy-phenol and 250 ml of glacial acetic acid are added and the product is precipitated with water. After two reprecipitations, from acetone and with water acidified with hydrochloric acid, and after drying, the yield is 157 g = approximately 79% of the theoretical yield.

| | | | |
|---|---|---|---|
| Analysis | Found | 7.5% N, | iodine number 138.4, acid number 58.1 |
| for 89% conversion, | Calculated | 7.7% N, | iodine number 139 acid number 41. |

EXAMPLE 8

A filtered solution comprising
8 g of the polymer used in Example 7 and
0.4 g of Michler's ketone in
92.0 g of methyl ethyl ketone
is whirler-coated onto commercially available electrochemically roughened aluminum foil. After drying (10 minutes at 50°C) the plate has a coating weight of 3.2 g/m². After 2 minutes' exposure under a negative original as described in Example 1, the plate is further processed as described in Example 7. More than 100,000 prints can be obtained from this plate.

EXAMPLE 9

A filtered solution comprising
4.0 g of the polymer described below,
1.0 g of pentaerythritol triacrylate and
0.18 g of Michler's ketone in
46 g of methyl ethyl ketone
is whirler-coated onto commercially available electrochemically roughened aluminum foil so that after drying the plate has a coating weight of 3.4 g/m². This plate is exposed for 2 minutes and further processed as described in Example 7. It can be used to print more than 100,000 prints on the printing machine.

The polymer used is manufactured as follows: 126 g (1 mole) of ethylene/maleic anhydride copolymer (EMA 21) are suspended in 750 ml of glacial acetic acid and 57 g (1 mole) of allylamine are added dropwise over the course of 10 minutes. Thereafter the mixture is heated to 115°C for 4 hours, while stirring. After cooling, 0.25 of p-methoxyphenol is added to the polymer solution. The reaction product is precipitated in water, is filtered off and is washed until neutral. After twice reprecipitating from acetone/water acidified with HCl, the yield is 136 g = 84% of the theoretical yield.

| | | | |
|---|---|---|---|
| Analysis: | Found | 7.5% N, | iodine number 139.4, acid number 53.1 |
| for 90% conversion | Calculated | 7.6% N, | iodine number 140.2 acid number 68.8 |

EXAMPLE 10

A coating solution comprising
4 g of the polymer used in Example 9 and
0.2 g of Michler's ketone in 46.0 g of methyl ethyl ketone
is filtered and applied to commercially available electrochemically roughened aluminum foil. After drying, the plate has a coating weight of 3.2 g/m². It is exposed for 2 minutes, like the plate described in Example 9, and is further processed as described in Exmple 7. On printing, this plate also gives more than 100,000 prints.

EXAMPLE 11

A filtered solution comprising
8 g of the polymer described below,
0.2 g of Michler's ketone and
0.2 g of 4,4'-dimethoxy-benzil in
92.0 g of 4-methyl-4-methoxy-pentanone-2
is whirler-coated onto a zinc plate such as is used for the manufacture of etched zinc plates. After drying, the plate is exposed for 4 minutes under a line sceen original, as described in Example 1. The unexposed parts of the layer are removed by immersion for 1 minute in methyl ethyl ketone. Thereafter the zinc plate is subjected to a one-step etching with 6% nitric acid (DOW etching, Gravomix K side-wall protectant). In the course thereof, the fully hardened polymer layer is not attacked by the etching agent or by the side-wall protectant. An etched zinc plate, such as is used in relief printing, is obtained.

The polymer used is manufactured as follows: 48.5 g (0.85 mole) of allylamine are added dropwise to a suspension of 156 g (1 mole) of GANTREZ AN 119 in 900 g of glacial acetic acid. The batch is heated for 2 hours to 118°C, 0.5 g of p-methoxyphenol is then added and the mixture is further worked up as in Example 1. The yield of the twice reprecipitated product is 166 g = 88% of the theoretical yield.

| | | | |
|---|---|---|---|
| Analysis: | Found | 5.9% N, | iodine number 110.3, acid number 84.5 |
| for 84% conversion | Calculated | 6.1% N, | iodine number 111.5 acid number 93. |

EXAMPLE 12

A filtered solution of
6 g of the polymer described below,
0.15 g of Michler's ketone and
0.15 g of 4,4'-dimethoxy-benzil in
14.0 g of methyl ethyl ketone
is applied to a nylon fabric (approximately 80 meshes/cm) and is dried. After 4 minutes' image-wise exposure of the coated fabric under an original, using a 5 W xenon lamp at a distance of 100 cm, the fabric is developed for 1 minute in acetone. A usable screen printing stencil is obtained.

The polymer used is manufactured as follows: 390 g (2.5 moles) of GANTREZ AN 169 are suspended in 3,400 ml of glacial acetic acid and 313.5 g of allylamine (5.5 moles) are added. The reaction mixture is warmed to 115°C and stirred at this temperature for 3 hours. After cooling, the viscous, red-brown solution is treated with 0.9 g of p-methoxyphenol. Thereafter, the polymer solution is allowed to run into water. The product which precipitates is filtered off, washed until neutral, and twice purified by reprecipitation from acetone/water acidified with HCl. After drying in air, the yield is 401.6 g = 82% of the theoretical yield.

| | | $(C_{10}H_{13}NO_3)$. | |
|---|---|---|---|
| Analysis: | Found | 72.% N, | iodine number 129.8, acid number 10 |
| for 99% conversion, | Calculated | 7.1% N, | iodine number 128.8, acid number 4. |

EXAMPLE 13

A solution of 6 g of the polymer described below and 0.3 g of 2.6-bis-(p-azidobenzal)-4-methyl-cyclohexanone in 44.0 g of methyl ethyl ketone is prepared and filtered. A 35$\mu$ thick copper foil laminated onto phenolic resin paper is coated by dipping it in this solution. The coating weight of the plate which has been treated in this way and dried is 3.5 g/m$^2$. After 2 minutes' exposure under a negative original as described in Example 1, the plate is developed by 2 minutes' immersion in methyl ethyl ketone and is subsequently etched for approximately 80 seconds at 43°C in a spray etching machine using iron-III chloride solution at 42° Be. The parts of the copper layer not protected by the hardened coating are removed by the etching agent and after rinsing with water and drying by means of air, a printed circuit as used in the electronics industry is obtained.

The polymer used is manufactured as follows:

126 g (1 mole) of EMA 31 are suspended in 750 g of glacial acetic acid and the suspension is treated with 114 g (2 moles) of allylamine. In the course thereof, the temperature rises to 74°C. Thereafter, the temperature is raised to approximately 120°C and kept thereat for 4 hours. The reaction mixture is then cooled and mixed with 0.2 g of p-methoxyphenol and 250 ml of glacial acetic acid, and the product is precipitated from water. After twice reprecipitating from acetone/water acidified with HCl, the yield is 111.2 g = 67% of the theoretical yield.

| Ethylene/maleic acid/N-allylimide copolymer $(C_9H_{11}NO_2)$ | | | |
|---|---|---|---|
| Analysis | Found | 8.1% N, | iodine number 151.2, acid number 15.4 |
| for 97% conversion, | Calculated | 8.1% N, | iodine number 150, acid number 21. |

EXAMPLE 14

A filtered solution of 8 g of the polymer described below, 0.2 g of Michler's ketone and 0.2 g of 4,4'-dimethoxy-benzil in 92.0 g of 4-methyl-4-methoxy-pentanone-2 is whirler-coated onto an electrochemically roughened and anodized aluminum carrier and subsequently dried for 10 minutes at 50°C. The plate thus produced is exposed for 2 minutes as described in Example 1, under a half-tone step wedge (Kodak, Photographic Step Table No. 2). The non-cross-linked polymer in the unexposed areas is dissolved by immersion in acetone for 1 minute. Thereafter, the plate is rendered hydrophilic with the agent for imparting properties used in Example 1, and is inked with a fatty ink. 5 to 6 step wedges of the grey wedge are depicted in full cover.

The polymer used is manufactured as follows: 202 g (1 mole) of a polymer of styrene and maleic anhydride (molar ratio 1:1) produced under precipitation conditions are suspended in 1,400 g of glacial acetic acid and 114 g (2 moles) of allylamine are added while stirring. In the course thereof, the temperature rises to approximately 70°C. After the addition of the allylamine, the mixture is warmed to 115°C and boiled under reflux for 5 hours. The red-brown solution is then cooled and 0.5 g of p-methoxyphenol is added. The polymer is prevented from precipitating on cooling by adding acetone. The reaction mixture treated with acetone is precipitated in water and reprecipitated once from acetone/water acidified with HCl. The coarsely granular product is washed until neutral and dried. Yield 220.5 g (approximately 91% of the theoretical yield) of styrene/maleic acid/N-allylimide copolymer $(C_{15}H_{15}NO_2)$.

| | | | |
|---|---|---|---|
| Analysis | Found | 5.4% N, | iodine number 97.5, acid number 25.8 |
| for 95% conversion, | Calculated | 5.5% N, | iodine number 100.3 acid number 8.8. |

EXAMPLE 15

A solution of 8 g of the polymer used in Example 14, 2.0 g of pentaerythritol triacrylate, 0.18 g of Michler's ketone and 0.18 g of 4,4'-dimethoxy-benzil in 92.0 g of 4-methyl-4-methoxy-pentanone-2 is processed as described in Example 14. The plate thus produced, after exposure, developing, hydrophilic treatment and inking with a fatty ink, depicts with full cover 10 to 11 step wedges of the grey wedge.

It will be obvious to those skilled in the art that many modifications may be made within the scope of the present invention without departing from the spirit thereof, and the invention includes all such modifications.

What is claimed is:

1. A light-sensitive copying composition which contains from 65 to 99 percent by weight of at least one copolymer containing from 10 to 55 mole percent of N-allyl-maleimide units, from 0 to 15 mole percent of maleic acid units and from 45 to 80 mole percent of units of the formula $$-Ch_2-CXZ-$$

wherein X is selected from the group consisting of a hydrogen atom, a halogen atom, an alkyl or alkoxy group containing from 1 to 3 carbon atoms, an aryl group or an acyloxy group, and Z is selected from the group consisting of a hydrogen atom, a halogen atom or an alkyl group containing 1 or 2 carbon atoms, from 0 to 35 percent by weight of at least one photopolymerizable compound having at least two vinyl or vinylidene groups in the molecule and which boils above 100°C under standard pressure, and from 1 to 8 percent by weight of at least one photoinitiator.

2. A composition as claimed in claim 1 which contains from 10 to 30 percent by weight of a photopolymerizable compound.

3. A composition as claimed in claim 1 wherein the photopolymerizable compound is an ester of acrylic and/or methacrylic acid with a polyhydric alcohol.

4. A composition as claimed in claim 1 which contains from 2 to 6 percent by weight of a photoinitiator.

5. A composition as claimed in claim 1 wherein Michler's ketone is the photoinitiator.

6. A light-sensitive copying composition as claimed in claim 1 in the form of a solid self-supporting layer.

7. A light-sensitive copying composition as claimed in claim 1 in the form of a layer of the light-sensitive composition on a carrier.

8. A material as claimed in claim 7 wherein the carrier is aluminum, zinc, copper, or a fine-mesh nylon fabric.

* * * * *